US012777924B2

(12) United States Patent
Yi et al.

(10) Patent No.: US 12,777,924 B2
(45) Date of Patent: Oct. 27, 2026

(54) CAPACITORS WITH FLOATING METAL LAYERS

(71) Applicant: GlobalFoundries Singapore Pte. Ltd., Singapore (SG)

(72) Inventors: Wanbing Yi, Singapore (SG); Ee Jan Khor, Singapore (SG); Jinglin Shi, Singapore (SG); Chio Yin Ong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 432 days.

(21) Appl. No.: 18/501,295

(22) Filed: Nov. 3, 2023

(65) Prior Publication Data

US 2025/0149434 A1 May 8, 2025

(51) Int. Cl.
*H10W 20/40* (2026.01)
*H10D 84/00* (2025.01)

(52) U.S. Cl.
CPC ........ *H10W 20/496* (2026.01); *H10D 84/212* (2025.01)

(58) Field of Classification Search
CPC ............... H10W 20/496; H10D 84/212; H01L 23/5223
See application file for complete search history.

(56) References Cited

U.S. PATENT DOCUMENTS 11,532,546 B2 12/2022 Dinh et al.
2005/0145987 A1* 7/2005 Okuda ................ H10W 20/496 257/532
2013/0113077 A1* 5/2013 Woo .................... H10W 20/496 257/532
2013/0342955 A1 12/2013 Zhang et al.
2014/0273394 A1* 9/2014 Roehner .................. H10D 1/47 438/396

OTHER PUBLICATIONS

N.-C. Chen, P.-Y. Chou, H. Graeb and M. P.-H. Lin, "High-density MOM capacitor array with novel mortise-tenon structure for low-power SAR ADC," Design, Automation & Test in Europe Conference & Exhibition (DATE), 2017.

* cited by examiner

*Primary Examiner* — Erik Kielin
(74) *Attorney, Agent, or Firm* — Francois Pagette

(57) ABSTRACT

The disclosed subject matter relates generally to capacitors in semiconductor devices and integrated circuit (IC) chips. More particularly, the present disclosure relates to a metal-dielectric-metal capacitor having electrically floating metal layers and an interconnect level that is devoid of any metal layers. The present disclosure provides a capacitor having a first interconnect level above a substrate, a first plurality of metal layers in the first interconnect level, a second interconnect level above the first interconnect level, a second plurality of metal layers in the second interconnect level, in which the metal layers in the second plurality of metal layers are electrically floating, a third interconnect level above the second interconnect level, the third interconnect level is devoid of any metal layers, a fourth interconnect level above the third interconnect level, and a third plurality of metal layers in the fourth interconnect level.

17 Claims, 5 Drawing Sheets

CAPACITORS WITH FLOATING METAL LAYERS

FIELD OF THE INVENTION

The present disclosure relates generally to capacitors in semiconductor devices and integrated circuit (IC) chips. More particularly, the present disclosure relates to a metal-dielectric-metal capacitor having floating metal layers and an interconnect level that is devoid of any metal layers.

BACKGROUND

Rapid advances in electronics technologies and semiconductor fabrication processes, driven by immense customer demand, have resulted in the worldwide adoption of electronic devices. At the same time, fabrication processes continue to achieve smaller dimensions. One of the fundamental circuit components of an electronic device is the capacitor. Improvements in capacitor fabrication techniques can allow the creation of capacitors with accurate and consistent capacitance values as the fabrication dimensions continue to shrink. One approach has been to stack multiple discrete capacitors on a printed circuit board or integrated circuit package. However, this approach can result in poor overall capacitor characteristics, a larger circuit footprint, and wasted board space between the capacitors due to finite spacing rules for discrete capacitors.

SUMMARY

In an aspect of the present disclosure, there is provided a capacitor having a first interconnect level above a substrate, a first plurality of metal layers in the first interconnect level, a second interconnect level above the first interconnect level, a second plurality of metal layers in the second interconnect level, in which the metal layers in the second plurality of metal layers are electrically floating, a third interconnect level above the second interconnect level, the third interconnect level is devoid of any metal layers, a fourth interconnect level above the third interconnect level, and a third plurality of metal layers in the fourth interconnect level.

In another aspect of the present disclosure, there is provided a capacitor having a first interconnect level above a substrate, a first plurality of metal layers in the first interconnect level, a second interconnect level above the first interconnect level, a second plurality of metal layers in the second interconnect level, the second plurality of metal layers includes a first position metal layer and a last position metal layer, in which the metal layers in the second plurality of metal layers are not connected to a voltage source or a current source, a third interconnect level above the second interconnect level, the third interconnect level includes a metal-less region that is devoid of any metal layers, the metal-less region has peripheral sides bounded by at least a vertical plane taken from a distal top edge of the first position metal layer in the second plurality of metal layers and a vertical plane taken from a distal top edge of the last position metal layer in the second plurality of metal layers, a fourth interconnect level above the third interconnect level, and a third plurality of metal layers in the fourth interconnect level.

In yet another aspect of the present disclosure, there is provided a capacitor having a first interconnect level above a substrate, a first plurality of metal layers in the first interconnect level, a second interconnect level above the first interconnect level, a second plurality of metal layers in the second interconnect level, in which the metal layers in the second plurality of metal layers are electrically floating, a third interconnect level above the second interconnect level, and a third plurality of metal layers in the third interconnect level.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIG. 1, FIG. 2, and FIG. 2A are cross-sectional views taken along line A-A in FIG. 3A, line B-B in FIG. 3B, and line C-C in FIG. 3C.

DETAILED DESCRIPTION

Various illustrative embodiments of the present disclosure are described below. The embodiments disclosed herein are exemplary and not intended to be exhaustive or limiting to the present disclosure.

Figure 1:
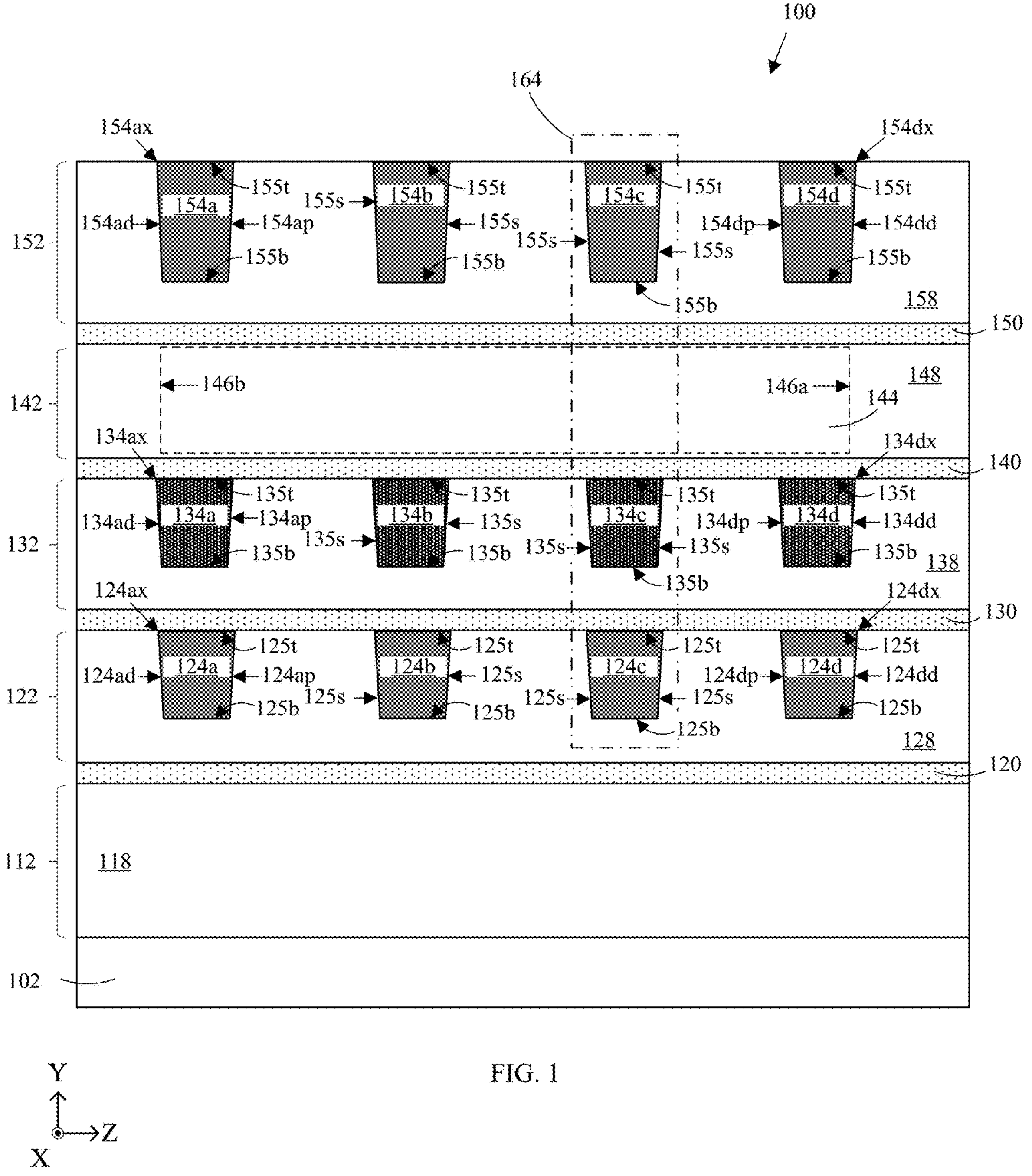
FIG. 1 is a cross-sectional view of an example capacitor in a semiconductor device.

Referring to FIG. 1, FIG. 2, FIG. 2A, FIG. 3A, FIG. 3B, and FIG. 3C, an exemplary capacitor in a semiconductor device may include a first interconnect level 122, a first plurality of metal layers 124*a*, 124*b*, 124*c*, 124*d* in the first interconnect level 122, a second interconnect level 132 above the first interconnect level 122, a second plurality of metal layers 134*a*, 134*b*, 134*c*, 134*d* in the second interconnect level 132, a third interconnect level 142 above the second interconnect level 132, a fourth interconnect level 152 above the third interconnect level 142, a third plurality of metal layers 154*a*, 154*b*, 154*c*, 154*d* in the fourth interconnect level 152. As shown in FIG. 1, the capacitor may be formed in a semiconductor device 100 having a substrate 102 and a dielectric region 112 formed on the substrate 102, in which the first interconnect level 122 may be formed on the dielectric region 112. The dielectric region 112 may include a dielectric material 118 and various interconnect structures (not shown) such as contact structures and conductive lines. The first interconnect level 122 may be formed over the dielectric region 112.

The interconnect levels 122, 132, 142, 152 may also include dielectric layers 128, 138, 148, 158, respectively. The dielectric layers 128, 138, 148, 158 may include, but are not limited to, silicon dioxide, tetraethyl orthosilicate (TEOS), or a material having a chemical composition of $SiC_xO_yH_z$, wherein x, y, and z are in stoichiometric ratio. The metal layers 124*a*, 124*b*, 124*c*, 124*d*, 134*a*, 134*b*, 134*c*, 134*d*, 154*a*, 154*b*, 154*c*, 154*d* in the respective interconnect levels 122, 132, 142, 152 may include a metal, such as tantalum (Ta), tungsten (W), ruthenium (Ru), cobalt (Co), copper (Cu), titanium (Ti), nickel (Ni), platinum (Pt), aluminum (Al), or an alloy thereof. Other suitable types of metal, alloys, or conductive materials may also be useful. The metal layers 124*a*, 124*b*, 124*c*, 124*d*, 134*a*, 134*b*, 134*c*, 134*d*, 154*a*, 154*b*, 154*c*, 154*d* may be formed using a damascene process (e.g., a single damascene or a dual damascene). Other techniques, such as reactive ion etch (RIE) may also be employed to form the metal layers 124*a*, 124*b*, 124*c*, 124*d*, 134*a*, 134*b*, 134*c*, 134*d*, 154*a*, 154*b*, 154*c*, 154*d*.

Figure 2:
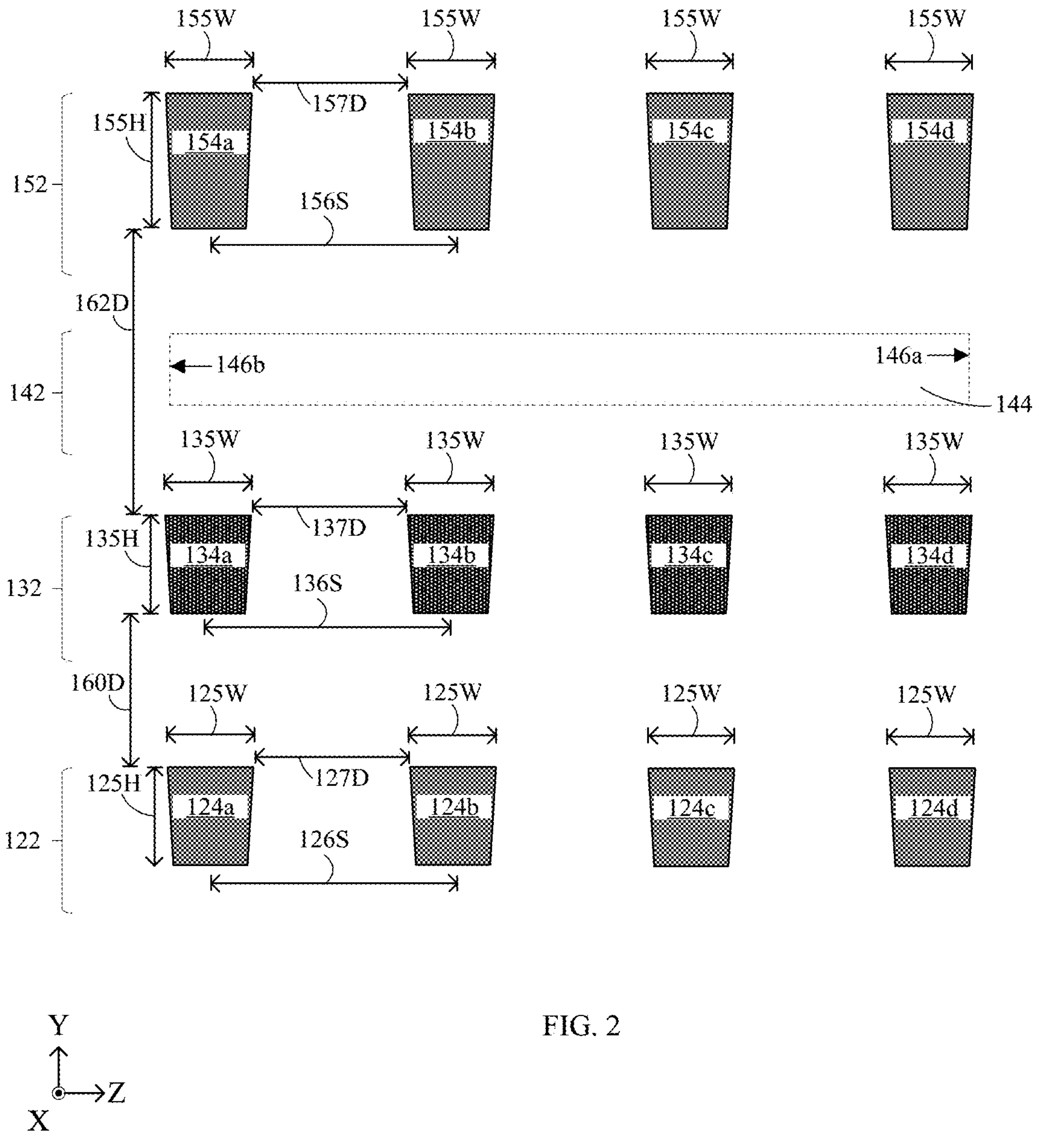
FIG. 2 and FIG. 2A are partial cross-sectional views of the example capacitor in FIG. 1 depicting exemplary arrangements of metal layers above a substrate.

The interconnect levels 122, 132, 142, 152 may refer to the interlayer dielectric levels formed by a BEOL processing of an integrated circuit (IC) chip. The semiconductor device 100 may include numerous interconnect levels. For example, an "n" number of interconnect levels may be formed in the semiconductor device. As shown in FIG. 1 and FIG. 2, the device may include 4 interconnect levels 122, 132, 142, 152, in which the number "n" is 4. Other numbers of interconnect levels may also be useful. The number of interconnect levels may depend on, for example, design requirements or the process involved. The interconnect levels 122, 132, 142, 152 may be arranged in a vertical stack.

Dielectric liners may be vertically interdigitated with the interconnect levels 122, 132, 142, 152 and the dielectric region 112. For example, a first dielectric liner 120 may be formed vertically between the first interconnect level 122 and the dielectric region 112, a second dielectric liner 130 may be formed vertically between the second interconnect level 132 and the first interconnect 122, a third dielectric liner 140 may be formed vertically between the third interconnect level 142 and the second interconnect level 132, and a fourth dielectric liner 150 may be formed vertically between the fourth interconnect level 152 and the third interconnect level 142. The dielectric liners 120, 130, 140, 150 may include, but are not limited to, silicon dioxide ($SiO_2$), silicon oxynitride (SiON), silicon nitride (SiN), Nitrogen doped silicon carbide (SiCN), $SiC_xH_z$, or $SiN_wC_xH_z$, wherein each of w, x, y, and z independently has a value greater than 0 and less than 0.75.

The first plurality of metal layers 124*a*, 124*b*, 124*c*, 124*d* and the third plurality of metal layers 154*a*, 154*b*, 154*c*, 154*d* may include alternating metal layers of different polarity. For example, the first plurality of metal layers 124*a*, 124*b*, 124*c*, 124*d* may include a first set of metal layers 124*a*, 124*c* and a second set of metal layers 124*b*, 124*d*, in which the first set of metal layers 124*a*, 124*c* may be of an opposite polarity to the second set of metal layers 124*b*, 124*d*. The first set of metal layers 124*a*, 124*c* may be interdigitated with the second set of metal layers 124*b*, 124*d*. The third plurality of metal layers 154*a*, 154*b*, 154*c*, 154*d* may include a third set of metal layers 154*b*, 154*d* and a fourth set of metal layers 154*a*, 154*c*, in which the third set of metal layers 154*b*, 154*d* may be of an opposite polarity to the fourth set of metal layers 154*a*, 154*c*. The third set of metal layers 154*b*, 154*d* may be interdigitated with the fourth set of metal layers 154*a*, 154*c*.

Figure 3A:
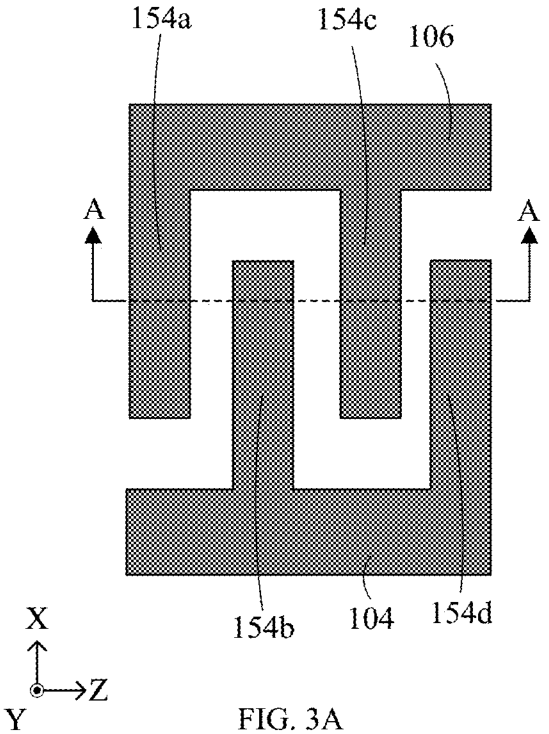
FIG. 3A, FIG. 3B, and FIG. 3C are top-down views depicting example layout arrangements of the metal layers in the example capacitor in FIG. 1, FIG. 2, and FIG. 2A.
Figure 3B:
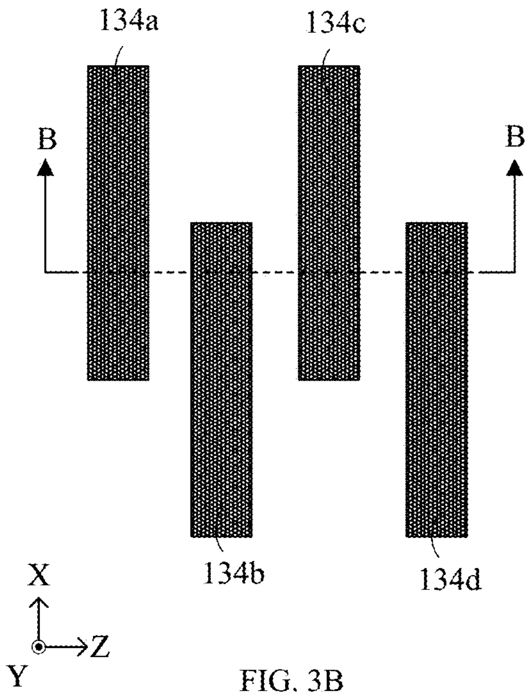
Figure 3C:
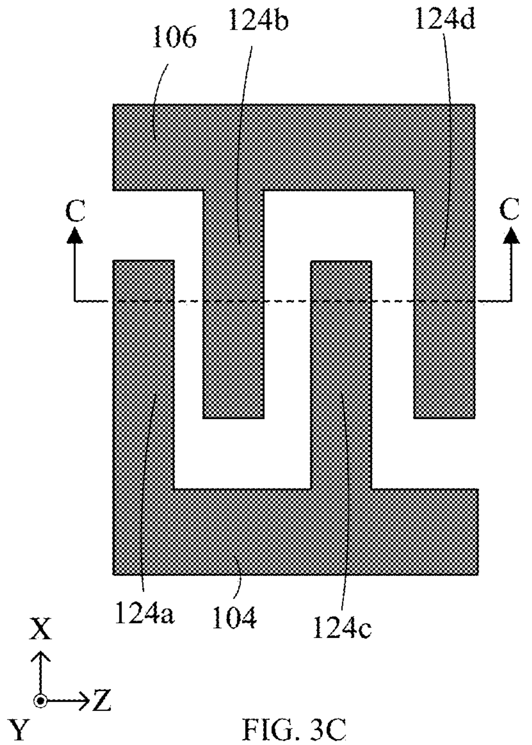

Referring briefly to FIG. 3A and FIG. 3C, the exemplary capacitor may also include an anode 104 and a cathode 106. In an implementation, the anode 104 may be connected to the first set of metal layers 124*a*, 124*c* in the first plurality of metal layers 124*a*, 124*b*, 124*c*, 124*d* (as shown in FIG. 3C) and the third set of metal layers 154*b*, 154*d* in the third plurality of metal layers 154*a*, 154*b*, 154*c*, 154*d* (as shown in FIG. 3A). The cathode 106 may be connected to the second set of metal layers 124*b*, 124*d* in the first plurality of metal layers 124*a*, 124*b*, 124*c*, 124*d* (as shown in FIG. 3C) and the fourth set of metal layers 154*a*, 154*c* in the third plurality of metal layers 154*a*, 154*b*, 154*c*, 154*d* (as shown in FIG. 3A). In other words, the first plurality of metal layers 124*a*, 124*b*, 124*c*, 124*d* may include a first set of metal layers 124*a*, 124*c* connected to the anode 104 and a second set of metal layers 124*b*, 124*d* connected to the cathode 106. The third plurality of metal layers 154*a*, 154*b*, 154*c*, 154*d* may include a third set of metal layers 154*b*, 154*d* connected to the anode 104 and a fourth set of metal layers 154*a*, 154*c* connected to the cathode 106. In another implementation, the anode 104 may have a positive charge while the cathode 106 may have a negative charge. Accordingly, in the first plurality of metal layers 124*a*, 124*b*, 124*c*, 124*d*, the first set of metal layers 124*a*, 124*c* may have a positive polarity while the second set of metal layers 124*b*, 124*d* may have a negative polarity. In the third plurality of metal layers 154*a*, 154*b*, 154*c*, 154*d*, the third set of metal layers 154*b*, 154*d* may have a positive polarity while the fourth set of metal layers 154*a*, 154*c* may have a negative polarity.

The metal layers in the second plurality of metal layers 134*a*, 134*b*, 134*c*, 134*d* may be electrically floating. In other words, the metal layers 134*a*, 134*b*, 134*c*, 134*d* may not be connected to a voltage source or a current source. The metal layers 134*a*, 134*b*, 134*c*, 134*d* may also not have any polarity (i.e., a positive or negative charge). For example, as shown in FIG. 3B, the anode 104 and the cathode 106 may not be connected to any of the metal layers 134*a*, 134*b*, 134*c*, 134*d* in the second plurality of metal layers.

Referring to FIG. 1 and FIG. 2, each metal layer in the third plurality of metal layers 154*a*, 154*b*, 154*c*, 154*d*, each metal layer in the second plurality of metal layers 134*a*, 134*b*, 134*c*, 134*d*, and each metal layer in the first plurality of metal layers 124*a*, 124*b*, 124*c*, 124*d* may be aligned along a vertical direction to provide a vertical column of metal layers. For example, as shown in FIG. 1, metal layer 154*c* in interconnect level 152 may be aligned vertically above metal layer 134*c* in interconnect level 132, metal layer 134*c* in interconnect level 132 may be aligned vertically above metal layer 124*c* in interconnect level 122 to provide a vertical column 164 of metal layers 124*c*, 134*c*, 154*c*. Likewise, metal layers 124*a*, 134*a*, 154*a*, metal layers 124*b*, 134*b*, 154*b*, and metal layers 124*d*, 134*d*, 154*d* may each provide a respective vertical column of metal layers. As used herein, a "horizontal" direction may refer to a direction or a vector substantially parallel to either the X axis or the Z axis (i.e., the XZ plane). A "vertical" direction may refer to a direction or a vector substantially parallel to the Y axis.

In respective vertical columns of metal layers, each metal layer in the first plurality of metal layers 124*a*, 124*b*, 124*c*, 124*d* may have an opposite polarity to each metal layer in the third plurality of metal layers 154*a*, 154*b*, 154*c*, 154*d*. Each metal layer in the second plurality of metal layers (being an electrically floating metal layer) may be aligned vertically between each metal layer in the first plurality of metal layers 124*a*, 124*b*, 124*c*, 124*d* and each metal layer in the third plurality of metal layers 154*a*, 154*b*, 154*c*, 154*d* in the respective vertical column of metal layers. For example, as shown in FIG. 1, metal layer 154*c* in interconnect level 152 may have an opposite polarity to metal layer 124*c* in interconnect level 122. Metal layer 134*c* in interconnect level 132 may be vertically between metal layer 154$c$ in interconnect level 152 and metal layer 124$c$ in interconnect level 122.

The metal layers in the respective first, second, and third pluralities of metal layers may be arranged parallel to each other. As shown in the accompanying drawings, each of the metal layers in the respective first, second, and third pluralities of metal layers may have a longitudinal length parallel to the X axis. The metal layers in the respective first, second, and third pluralities of metal layers may be arranged along a direction parallel to the Z axis or perpendicular to their longitudinal lengths. Each of the first, second, and third pluralities of metal layers may be arranged to include at least a first position metal layer and a last position metal layer. For example, in the first interconnect level 122, the first plurality of metal layers 124$a$, 124$b$, 124$c$, 124$d$ may include a first position metal layer 124$a$, intermediate position metal layers 124$b$, 124$c$, and a last position metal layer 124$d$. The first plurality of metal layers 124$a$, 124$b$, 124$c$, 124$d$ may be arranged along a direction parallel to the Z axis. In the second interconnect level 132, the second plurality of metal layers 134$a$, 134$b$, 134$c$, 134$d$ may include a first position metal layer 134$a$, intermediate position metal layers 134$b$, 134$c$, and a last position metal layer 134$d$. The second plurality of metal layers 134$a$, 134$b$, 134$c$, 134$d$ may be arranged along a direction parallel to the Z axis. In the fourth interconnect level 152, the third plurality of metal layers 154$a$, 154$b$, 154$c$, 154$d$ may include a first position metal layer 154$a$, intermediate position metal layers 154$b$, 154$c$, and a last position metal layer 154$d$. The third plurality of metal layers 154$a$, 154$b$, 154$c$, 154$d$ may be arranged along a direction parallel to the Z axis.

Figure 2A:
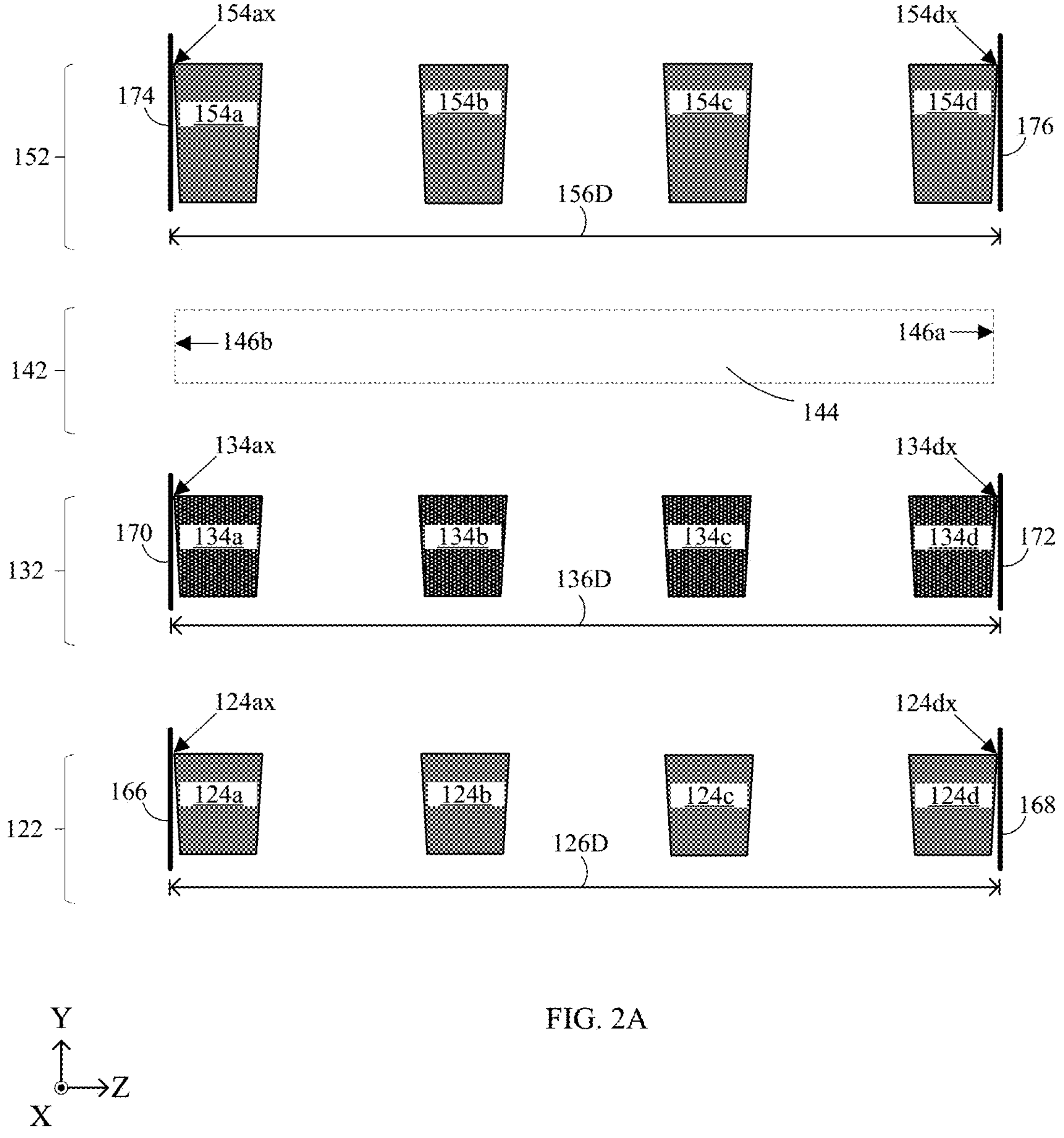

As shown in FIG. 1 and FIG. 2A, the metal layers in the first plurality of metal layers 124$a$, 124$b$, 124$c$, 124$d$ may have a top surface 125$t$, a bottom surface 125$b$, and side surfaces 125$s$. The first position metal layer 124$a$ may have side surfaces 124$ad$, 124$ap$ and the last position metal layer 124$d$ may have side surfaces 124$dd$, 124$dp$. The side surface 124$ad$ of the first position metal layer 124$a$ may be referred to as a distal side surface 124$ad$ and the side surface 124$ap$ of the first position metal layer 124$a$ may be referred to as a proximal side surface 124$ap$. The distal side surface 124$ad$ of the first position metal layer 124$a$ refers to the side surface that is further from the adjacent intermediate position metal layer 124$b$ while the proximal side surface 124$ap$ of the first position metal layer 124$a$ refers to the side surface that is nearer to the adjacent intermediate position metal layer 124$b$. The distal side surface 124$ad$ of the first position metal layer 124$a$ may meet the top surface 125$t$ of the first position metal layer 124$a$ to form a distal top edge 124$ax$ of the first position metal layer 124$a$. Likewise, the side surface 124$dd$ of the last position metal layer 124$d$ may be referred to as a distal side surface 124$dd$ and the side surface 124$dp$ of the last position metal layer 124$d$ may be referred to as a proximal side surface 124$dp$. The distal side surface 124$dd$ of the last position metal layer 124$d$ refers to the side surface that is further from the adjacent intermediate position metal layer 124$c$ while the proximal side surface 124$dp$ of the last position metal layer 124$d$ refers to the side surface that is nearer to the adjacent intermediate position metal layer 124$c$. The distal side surface 124$dd$ of the last position metal layer 124$d$ may meet the top surface 125$t$ of the last position metal layer 124$d$ to form a distal top edge 124$dx$ of the last position metal layer 124$d$.

The metal layers in the second plurality of metal layers 134$a$, 134$b$, 134$c$, 134$d$ may have a top surface 135$t$, a bottom surface 135$b$, and side surfaces 135$s$. The first position metal layer 134$a$ may have side surfaces 134$ad$, 134$ap$ and the last position metal layer 134$d$ may have side surfaces 134$dd$, 134$dp$. The side surface 134$ad$ of the first position metal layer 134$a$ be referred to as a distal side surface 134$ad$ and the side surface 134$ap$ of the first position metal layer 134$a$ may be referred to as a proximal side surface 134$ap$. The side surface 134$dd$ of the last position metal layer 134$d$ may be referred to as a distal side surface 134$dd$ and the side surface 134$dp$ of the last position metal layer 134$d$ may be referred to as a proximal side surface 134$dp$. The distal side surface 134$ad$, 134$dd$ and the proximal side surface 134$ap$, 134$dp$ of the respective first position metal layer 134$a$ and last position metal layer 134$d$ in the second plurality of metal layers 134$a$, 134$b$, 134$c$, 134$d$ are defined similarly as the distal side surface 124$ad$, 124$dd$ and the proximal side surface 124$ap$, 124$dp$ of the respective first position metal layer 124$a$ and last position metal layer 124$d$ in the first plurality of metal layers 124$a$, 124$b$, 124$c$, 124$d$. The distal side surface 134$ad$ of the first position metal layer 134$a$ may meet the top surface 135$t$ of the first position metal layer 134$a$ to form a distal top edge 134$ax$ of the first position metal layer 134$a$. The distal side surface 134$dd$ of the last position metal layer 134$d$ may meet the top surface 135$t$ of the last position metal layer 134$d$ to form a distal top edge 134$dx$ of the last position metal layer 134$d$.

The metal layers in the third plurality of metal layers 154$a$, 154$b$, 154$c$, 154$d$ may have a top surface 155$t$, a bottom surface 155$b$, and side surfaces 155$s$. The first position metal layer 154$a$ may have side surfaces 154$ad$, 154$ap$ and the last position metal layer 154$d$ may have side surfaces 154$dd$, 154$dp$. The side surface 154$ad$ of the first position metal layer 154$a$ be referred to as a distal side surface 154$ad$ and the side surface 154$ap$ of the first position metal layer 154$a$ may be referred to as a proximal side surface 154$ap$. The side surface 154$dd$ of the last position metal layer 154$d$ may be referred to as a distal side surface 154$dd$ and the side surface 154$dp$ of the last position metal layer 154$d$ may be referred to as a proximal side surface 154$dp$. The distal side surface 154$ad$, 154$dd$ and the proximal side surface 154$ap$, 154$dp$ of the respective first position metal layer 154$a$ and last position metal layer 154$d$ in the third plurality of metal layers 154$a$, 154$b$, 154$c$, 154$d$ are defined similarly as the distal side surface 124$ad$, 124$dd$ and the proximal side surface 124$ap$, 124$dp$ of the respective first position metal layer 124$a$ and last position metal layer 124$d$ in the first plurality of metal layers 124$a$, 124$b$, 124$c$, 124$d$. The distal side surface 154$ad$ of the first position metal layer 154$a$ may meet the top surface 155$t$ of the first position metal layer 154$a$ to form a distal top edge 154$ax$ of the first position metal layer 154$a$. The distal side surface 154$dd$ of the last position metal layer 154$d$ may meet the top surface 155$t$ of the last position metal layer 154$d$ to form a distal top edge 154$dx$ of the last position metal layer 154$d$.

In each of the first, second, and third pluralities of metal layers, a horizontal displacement may be defined between a vertical plane taken from the respective distal top edge of the first position metal layer and a vertical plane taken from the respective distal top edge of the last position metal layer. For example, as shown in FIG. 2A, the first plurality of metal layers 124$a$, 124$b$, 124$c$, 124$d$ may have a horizontal displacement 126D defined between a vertical plane 166 taken from the distal top edge 124$ax$ of the first position metal layer 124$a$ and a vertical plane 168 taken from the distal top edge 124$dx$ of the last position metal layer 124$d$. The second plurality of metal layers 134$a$, 134$b$, 134$c$, 134$d$ may have a horizontal displacement 136D defined between a vertical plane 170 taken from the distal top edge 134$ax$ of the first position metal layer 134_a_ and a vertical plane 172 taken from the distal top edge 134_dx_ of the last position metal layer 134_d_. The third plurality of metal layers 154_a_, 154_b_, 154_c_, 154_d_ may have a horizontal displacement 156D defined between a vertical plane 174 taken from the distal top edge 154_ax_ of the first position metal layer 154_a_ and a vertical plane 176 taken from the distal top edge 154_dx_ of the last position metal layer 154_d_.

The vertical planes 166, 168, 170, 172, 174, 176 may be parallel to the XY plane. In some embodiments, the vertical plane 166 taken from the distal top edge 124_ax_ of the first position metal layer 124_a_ in the first interconnect level 122, the vertical plane 170 taken from the distal top edge 134_ax_ of the first position metal layer 134_a_ in the second interconnect level 132, and the vertical plane 174 taken from the distal top edge 154_ax_ of the first position metal layer 154_a_ in the fourth interconnect level 152 may be aligned along a same plane. The vertical plane 168 taken from the distal top edge 124_dx_ of the last position metal layer 124_d_ in the first interconnect level 122, the vertical plane 172 taken from the distal top edge 134_dx_ of the last position metal layer 134_d_ in the second interconnect level 132, and the vertical plane 176 taken from the distal top edge 154_dx_ of the last position metal layer 154_d_ in the fourth interconnect level 152 may be aligned along a same plane.

As shown in FIG. 1, FIG. 2, and FIG. 2A, the third interconnect level 142 may be devoid of, or does not have, any metal layers. For example, the third interconnect level 142 may be devoid of any metal layers throughout its entirety, or the third interconnect level 142 may include a metal-less region 144 that is devoid of any metal layers. In examples where the third interconnect level 142 has a metal-less region 144, metal layers may be present outside of the metal-less region 144. The metal-less region 144 may have opposing peripheral sides 146_a_, 146_b_, in which the peripheral sides 146_a_, 146_b_ may be bounded by at least the vertical plane 170 taken from the distal top edge 134_ax_ of the first position metal layer 134_a_ in the second plurality of metal layers 134_a_, 134_b_, 134_c_, 134_d_ and the vertical plane 172 taken from the distal top edge 134_dx_ of the last position metal layer 134_d_ in the second plurality of metal layers 134_a_, 134_b_, 134_c_, 134_d_ such that the peripheral sides 146_a_, 146_b_ of the metal-less region 144 may be separated laterally by a displacement approximately equal to the horizontal displacement 136D described herein. The peripheral sides 146_a_, 146_b_ of the metal-less region 144 may also be bounded by the vertical plane 174 taken from the distal top edge 154_ax_ of the first position metal layer 154_a_ in the third plurality of metal layers 154_a_, 154_b_, 154_c_, 154_d_ and the vertical plane 176 taken from the distal top edge 154_dx_ of the last position metal layer 154_d_ in the third plurality of metal layers 154_a_, 154_b_, 154_c_, 154_d_ such that the peripheral sides 146_a_, 146_b_ of the metal-less region 144 may be separated laterally by a displacement approximately equal to the horizontal displacement 156D described herein. The metal-less region 144 in the third interconnect level 142 may be aligned vertically between the second plurality of metal layers 134_a_, 134_b_, 134_c_, 134_d_ and the third plurality of metal layers 154_a_, 154_b_, 154_c_, 154_d_. For example, in the respective vertical column of metal layers described herein, the metal-less region 144 may vertically separate each metal layer in the second plurality of metal layers 134_a_, 134_b_, 134_c_, 134_d_ from each metal layer in the third plurality of metal layers 154_a_, 154_b_, 154_c_, 154_d_. In other words, each metal layer in the second plurality of metal layers 134_a_, 134_b_, 134_c_, 134_d_ may be vertically separated from each metal layer in the third plurality of metal layers 154_a_, 154_b_, 154_c_, 154_d_ by the dielectric material 148 in the third interconnect level 142, the dielectric liner 140 between the third interconnect level 142 and the fourth interconnect level 152, and the dielectric liner 150 between the third interconnect level 142 and the second interconnect level 132.

Advantageously, by configuring the third interconnect level 142 to have no metal layers and arranging the third interconnect level 142 vertically between the second plurality of electrically floating metal layers 134_a_, 134_b_, 134_c_, 134_d_ and the third plurality of metal layers 154_a_, 154_b_, 154_c_, 154_d_ (being connected to an anode 104 and a cathode 106), it is found that a higher capacitance density of the capacitor can be achieved while also ensuring the reduction of the footprint of the capacitor.

As shown in FIG. 2, a vertical displacement 162D between the bottom surface 155_b_ of each metal layer in the third plurality of metal layers 154_a_, 154_b_, 154_c_, 154_d_ and the top surface 135_t_ of each metal layer in the second plurality of metal layers 134_a_, 134_b_, 134_c_, 134_d_ may be larger than a vertical displacement 160D between the bottom surface 135_b_ of each metal layer in the second plurality of metal layers 134_a_, 134_b_, 134_c_, 134_d_ and the top surface 125_t_ of each metal layer in the first plurality of metal layers 124_a_, 124_b_, 124_c_, 124_d_.

Each metal layer in the first plurality of metal layers 124_a_, 124_b_, 124_c_, 124_d_ may have a first height dimension 155H, which may be defined as a vertical distance between the top surface 125_t_ and the bottom surface 125_b_ of each metal layer in the first plurality of metal layers 124_a_, 124_b_, 124_c_, 124_d_. Each metal layer in the second plurality of metal layers 134_a_, 134_b_, 134_c_, 134_d_ may have a second height dimension 135H, which may be defined as a vertical distance between the top surface 135_t_ and the bottom surface 135_b_ of each metal layer in the second plurality of metal layers 134_a_, 134_b_, 134_c_, 134_d_. Each metal layer in the third plurality of metal layers 154_a_, 154_b_, 154_c_, 154_d_ may have a third height dimension 155H, which may be defined as a vertical distance between the top surface 155_t_ and the bottom surface 155_b_ of each metal layer in the third plurality of metal layers 154_a_, 154_b_, 154_c_, 154_d_. The third height dimension 155H may be larger than the first height dimension 125H and the second height dimension 135H. The second height dimension 135H may be the same as the first height dimension 125H.

Each metal layer in the first plurality of metal layers 124_a_, 124_b_, 124_c_, 124_d_ may have a width 125W, which may be defined as a lateral distance between side surfaces 155_s_ of each metal layer in the first plurality of metal layers 124_a_, 124_b_, 124_c_, 124_d_. The metal layers 124_a_, 124_b_, 124_c_, 124_d_ in the first plurality of metal layers may have the same width 125W. Each metal layer in the second plurality of metal layers 134_a_, 134_b_, 134_c_, 134_d_ may have a width 135W, which may be defined as a lateral distance between side surfaces 135_s_ of each metal layer in the second plurality of metal layers 134_a_, 134_b_, 134_c_, 134_d_. The metal layers 134_a_, 134_b_, 134_c_, 134_d_ in the second plurality of metal layers may have the same width 135W. Each metal layer in the third plurality of metal layers 154_a_, 154_b_, 154_c_, 154_d_ may have a width 155W, which may be defined as a lateral distance between the side surfaces 155_s_ of each metal layer in the third plurality of metal layers 154_a_, 154_b_, 154_c_, 154_d_. The metal layers 154_a_, 154_b_, 154_c_, 154_d_ in the third plurality of metal layers may have the same width 155W. In an embodiment, within each respective column of metal layers, the widths 125W, 135W, 155W of the metal layers may be the same.

Each of the first, second, and third pluralities of metal layers may be arranged to have a pitch, which may be defined as a lateral spacing between centers of two immediately adjacent metal layers (i.e., no intervening metal layers in-between). For example, the first plurality of metal layers 124*a*, 124*b*, 124*c*, 124*d* may have a pitch 126S, the second plurality of metal layers 134*a*, 134*b*, 134*c*, 134*d* may have a pitch 136S, and the third plurality of metal layers 154*a*, 154*b*, 154*c*, 154*d* may have a pitch 156S. The first, second, and third pluralities of metal layers may have a uniform pitch, respectively. In an embodiment, the first plurality of metal layers 124*a*, 124*b*, 124*c*, 124*d*, the second plurality of metal layers 134*a*, 134*b*, 134*c*, 134*d*, and the third plurality of metal layers 154*a*, 154*b*, 154*c*, 154*d* may have the same pitch.

Each of the first, second, and third pluralities of metal layers may be arranged to have a metal layer spacing, which may be defined as a lateral spacing between opposing side surfaces of two immediately adjacent metal layers (i.e., no intervening metal layers in-between), in which the lateral spacing is taken along the top surface of the respective two immediately adjacent metal layers. For example, the first plurality of metal layers 124*a*, 124*b*, 124*c*, 124*d* may have a metal layer spacing 127D, the second plurality of metal layers 134*a*, 134*b*, 134*c*, 134*d* may have a metal layer spacing 137D, and the third plurality of metal layers 154*a*, 154*b*, 154*c*, 154*d* may have a metal layer spacing 157D. The first, second, and third pluralities of metal layers may have a uniform metal layer spacing, respectively. In some embodiments, the first plurality of metal layers 124*a*, 124*b*, 124*c*, 124*d*, the second plurality of metal layers 134*a*, 134*b*, 134*c*, 134*d*, and the third plurality of metal layers 154*a*, 154*b*, 154*c*, 154*d* may have the same metal layer spacing.

In an embodiment, the metal layer spacing 127D in the first plurality of metal layers 124*a*, 124*b*, 124*c*, 124*d* may be approximately equal to a sum of the vertical displacement 162D between the bottom surface 155*b* of each metal layer in the third plurality of metal layers 154*a*, 154*b*, 154*c*, 154*d* and the top surface 135*t* of each metal layer in the second plurality of metal layers 134*a*, 134*b*, 134*c*, 134*d* and the vertical displacement 160D between the bottom surface 135*b* of each metal layer in the second plurality of metal layers 134*a*, 134*b*, 134*c*, 134*d* and the top surface 125*t* of each metal layer in the first plurality of metal layers 124*a*, 124*b*, 124*c*, 124*d*.

Figure 4:
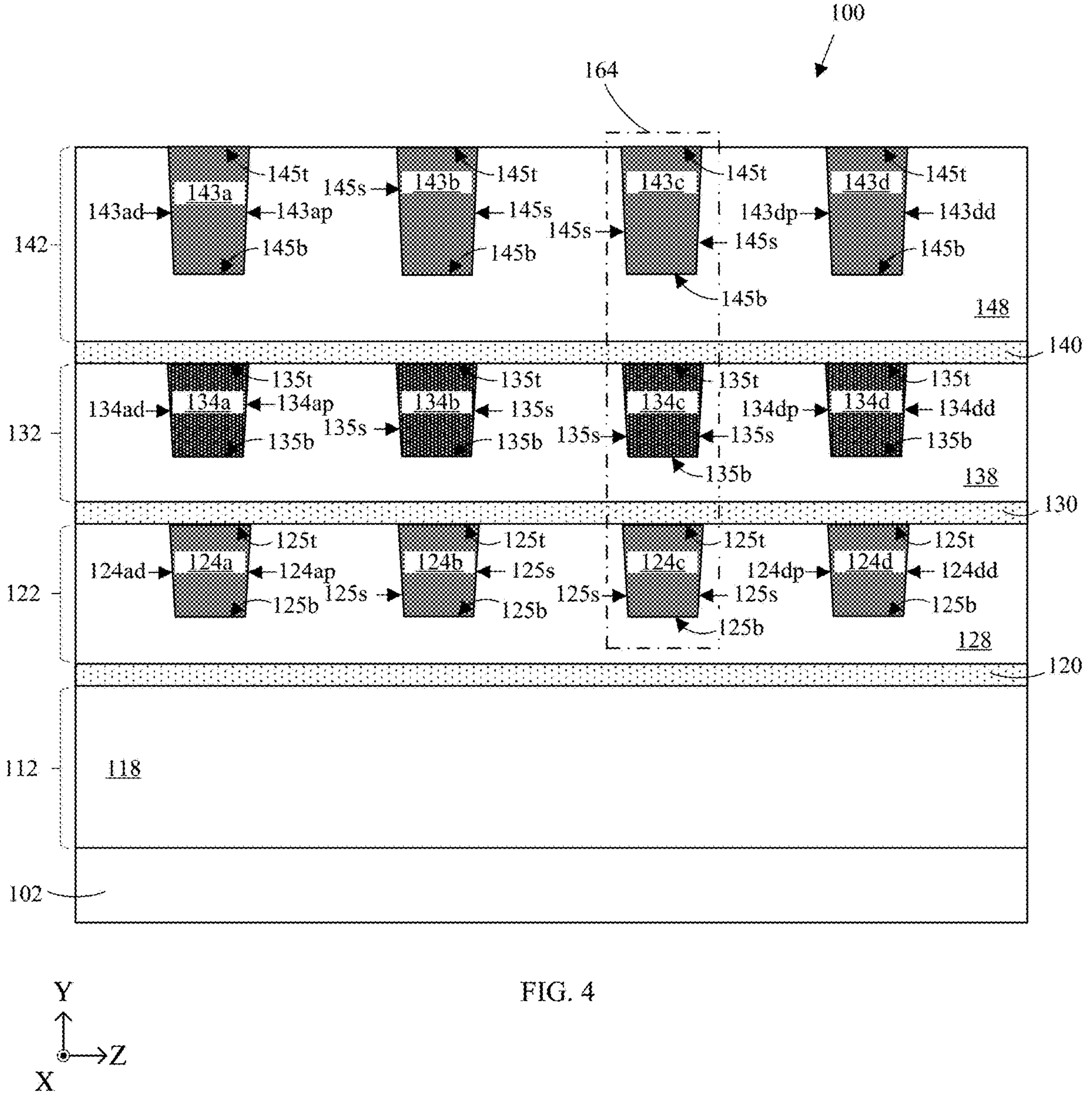
FIG. 4 is a cross-sectional view of another example capacitor in a semiconductor device.

FIG. 4 illustrates another example of the capacitor in a semiconductor device. As shown in FIG. 4, in which like reference numerals refer to like features in FIG. 1, the capacitor may include a first interconnect level 122 above a substrate 102, a first plurality of metal layers 124*a*, 124*b*, 124*c*, 124*d* in the first interconnect level 122, a second interconnect level 132 above the first interconnect level 122, a second plurality of metal layers 134*a*, 134*b*, 134*c*, 134*d* in the second interconnect level 132, a third interconnect level 142 above the second interconnect level 132, and a third plurality of metal layers 143*a*, 143*b*, 143*c*, 143*d* in the third interconnect level 142. The metal layers 134*a*, 134*b*, 134*c*, 134*d* in the second plurality of metal layers are electrically floating. In other words, the metal layers 134*a*, 134*b*, 134*c*, 134*d* may not be connected to a voltage source or a current source. The metal layers 134*a*, 134*b*, 134*c*, 134*d* may also not have any polarity (i.e., a positive or negative charge). In some embodiments, as shown in FIG. 4, the second interconnect level 132 may be immediately above the first interconnect level 122 and immediately below the third interconnect level 142 such that there are no intervening interconnect levels between the first and second interconnect levels (122 and 132) and between the second and third interconnect levels (132 and 142).

With reference to FIG. 3A, FIG. 3B, FIG. 3B and FIG. 4, the first plurality of metal layers 124*a*, 124*b*, 124*c*, 124*d* may include a first set of metal layers 124*a*, 124*c* and a second set of metal layers 124*b*, 124*d*, in which the first set of metal layers 124*a*, 124*c* may be of an opposite polarity to the second set of metal layers 124*b*, 124*d*. The first set of metal layers 124*a*, 124*c* may be interdigitated with the second set of metal layers 124*b*, 124*d*. The third plurality of metal layers 143*a*, 143*b*, 143*c*, 143*d* may include a third set of metal layers 143*b*, 143*d* and a fourth set of metal layers 143*a*, 143*c*, in which the third set of metal layers 143*b*, 143*d* may be of an opposite polarity to the fourth set of metal layers 143*a*, 143*c*. The third set of metal layers 143*b*, 143*d* may be interdigitated with the fourth set of metal layers 143*a*, 143*c*.

Similar to the example described in FIG. 1 and referencing FIG. 3A, FIG. 3B, and FIG. 3C, the capacitor illustrated in FIG. 4 may include an anode 104 and a cathode 106. The anode 104 and the cathode 106 may not be connected to any of the metal layers 134*a*, 134*b*, 134*c*, 134*d* in the second plurality of metal layers. The anode 104 may be connected to the first set of metal layers 124*a*, 124*c* in the first plurality of metal layers 124*a*, 124*b*, 124*c*, 124*d* and the third set of metal layers 143*b*, 143*d* in the third plurality of metal layers 143*a*, 143*b*, 143*c*, 143*d*. The cathode 106 may be connected to the second set of metal layers 124*b*, 124*d* in the first plurality of metal layers 124*a*, 124*b*, 124*c*, 124*d* and the fourth set of metal layers 143*a*, 143*c* in the third plurality of metal layers 143*a*, 143*b*, 143*c*, 143*d*. In other words, the first plurality of metal layers 124*a*, 124*b*, 124*c*, 124*d* may include a first set of metal layers 124*a*, 124*c* connected to the anode 104 and a second set of metal layers 124*b*, 124*d* connected to the cathode 106. The third plurality of metal layers 143*a*, 143*b*, 143*c*, 143*d* may include a third set of metal layers 143*b*, 143*d* connected to the anode 104 and a fourth set of metal layers 143*a*, 143*c* connected to the cathode 106. In some implementations, the anode 104 may have a positive charge while the cathode 106 may have a negative charge. Accordingly, in the first plurality of metal layers 124*a*, 124*b*, 124*c*, 124*d*, the first set of metal layers 124*a*, 124*c* may have a positive polarity while the second set of metal layers 124*b*, 124*d* may have a negative polarity. In the third plurality of metal layers 143*a*, 143*b*, 143*c*, 143*d*, the third set of metal layers 143*b*, 143*d* may have a positive polarity while the fourth set of metal layers 143*a*, 143*c* may have a negative polarity.

Each metal layer in the third plurality of metal layers 143*a*, 143*b*, 143*c*, 143*d*, each metal layer in the second plurality of metal layers 134*a*, 134*b*, 134*c*, 134*d*, and each metal layer in the first plurality of metal layers 124*a*, 124*b*, 124*c*, 124*d* may be aligned along a vertical direction to provide a vertical column of metal layers. For example, as shown in FIG. 4, metal layer 143*c* in interconnect level 142 may be aligned vertically above metal layer 134*c* in interconnect level 132, metal layer 134*c* in interconnect level 132 may be aligned vertically above metal layer 124*c* in interconnect level 122 to provide a vertical column 164 of metal layers 124*c*, 134*c*, 143*c*. Likewise, metal layers 124*a*, 134*a*, 143*a*, metal layers 124*b*, 134*b*, 143*b*, and metal layers 124*d*, 134*d*, 143*d* may each provide a respective vertical column of metal layers.

In respective vertical columns of metal layers, each metal layer in the first plurality of metal layers 124*a*, 124*b*, 124*c*, 124*d* may have an opposite polarity to each metal layer in the third plurality of metal layers 143*a*, 143*b*, 143*c*, 143*d*.

Each metal layer in the second plurality of metal layers (being an electrically floating metal layer) may be aligned vertically between each metal layer in the first plurality of metal layers 124*a*, 124*b*, 124*c*, 124*d* and each metal layer in the third plurality of metal layers 143*a*, 143*b*, 143*c*, 143*d* in the respective vertical column of metal layers. For example, as shown in FIG. 4, metal layer 143*c* in interconnect level 142 may have an opposite polarity to metal layer 124*c* in interconnect level 122. Metal layer 134*c* in interconnect level 132 may be vertically between metal layer 143*c* in interconnect level 142 and metal layer 124*c* in interconnect level 122.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed structures in semiconductor devices and the methods of forming the structures in the semiconductor devices may be employed in manufacturing a variety of different integrated circuit products, including, but not limited to, logic devices, memory devices, radio frequency applications, high power applications, etc.

What is claimed is:

1. A capacitor comprising:
- a first interconnect level above a substrate;
- a first plurality of metal layers in the first interconnect level;
- a second interconnect level above the first interconnect level;

- a second plurality of metal layers in the second interconnect level, wherein the metal layers in the second plurality of metal layers are electrically floating;
- a third interconnect level above the second interconnect level, the third interconnect level is devoid of any metal layers;
- a fourth interconnect level above the third interconnect level; and
- a third plurality of metal layers in the fourth interconnect level, wherein each metal layer in the third plurality of metal layers is aligned above each metal layer in the first plurality of metal layers along a vertical direction, and wherein each metal layer in the third plurality of metal layers has an opposite polarity to each respective metal layer in the first plurality of metal layers aligned along the vertical direction.

2. The capacitor of claim 1, wherein the metal layers in the second plurality of metal layers are not connected to a voltage source or a current source.

3. The capacitor of claim 1, wherein each metal layer in the second plurality of metal layers is aligned vertically between each metal layer in the first plurality of metal layers and each metal layer in the third plurality of metal layers along the vertical direction.

4. The capacitor of claim 3, wherein the first plurality of metal layers and the third plurality of metal layers include alternating metal layers of different polarity.

5. The capacitor of claim 3, wherein the first plurality of metal layers includes a first set of metal layers having a positive polarity and a second set of metal layers having a negative polarity, the first set of metal layers is interdigitated with the second set of metal layers, and wherein the third plurality of metal layers include a third set of metal layers having a positive polarity and a fourth set of metal layers having a negative polarity, the third set of metal layers is interdigitated with the fourth set of metal layers.

6. The capacitor of claim 5, further comprising an anode and a cathode, wherein the anode is connected to the first set of metal layers in the first plurality of metal layers and the third set of metal layers in the third plurality of metal layers, and the cathode is connected to the second set of metal layers in the first plurality of metal layers and the fourth set of metal layers in the third plurality of metal layers.

7. The capacitor of claim 3, wherein each metal layer in the first plurality of metal layers has a first height dimension, each metal layer in the second plurality of metal layers has a second height dimension, and each metal layer in the third plurality of metal layers has a third height dimension, the third height dimension is larger than the first height dimension and the second height dimension.

8. The capacitor of claim 7, wherein the second height dimension is the same as the first height dimension.

9. The capacitor of claim 3, wherein the first plurality of metal layers, the second plurality of metal layers, and the third plurality of metal layers have the same pitch.

10. A capacitor comprising:
- a first interconnect level above a substrate;
- a first plurality of metal layers in the first interconnect level;
- a second interconnect level above the first interconnect level;
- a second plurality of metal layers in the second interconnect level, the second plurality of metal layers includes a first position metal layer and a last position metal layer, wherein the metal layers in the second plurality of metal layers are not connected to a voltage source or a current source;

a third interconnect level above the second interconnect level, the third interconnect level includes a metal-less region that is devoid of any metal layers, the metal-less region has opposing peripheral sides bounded by at least a vertical plane taken from a distal top edge of the first position metal layer in the second plurality of metal layers and a vertical plane taken from at a distal top edge of the last position metal layer in the second plurality of metal layers;

a fourth interconnect level above the third interconnect level; and a third plurality of metal layers in the fourth interconnect level, wherein each metal layer in the third plurality of metal layers, each metal layer in the second plurality of metal layers, and each metal layer in the first plurality of metal layers are aligned along a vertical direction to provide a vertical column of metal layers, and wherein each metal layer in the first plurality of metal layers has an opposite polarity to each metal layer in the third plurality of metal layers in the respective vertical column of metal layers.

11. The capacitor of claim 10, further comprising an anode and a cathode, wherein the first plurality of metal layers includes a first set of metal layers connected to the anode and a second set of metal layers connected to the cathode, the first set of metal layers is interdigitated with the second set of metal layers, and wherein the third plurality of metal layers include a third set of metal layers connected to the anode and a fourth set of metal layers connected to the cathode, the third set of metal layers is interdigitated with the fourth set of metal layers.

12. The capacitor of claim 10, wherein each metal layer in the second plurality of metal layers is between each metal layer in the first plurality of metal layers and each metal layer in the third plurality of metal layers in the respective vertical column of metal layers.

13. The capacitor of claim 10, wherein the third plurality of metal layers includes a first position metal layer and a last position metal layer, the peripheral sides of the metal-less region are bounded by at least a vertical plane taken from a distal top edge of the first position metal layer in the third plurality of metal layers and a vertical plane taken from a distal top edge of the last position metal layer in the third plurality of metal layers, and wherein the metal-less region is aligned vertically between the second plurality of metal layers and the third plurality of metal layers.

14. The capacitor of claim 13, wherein each metal layer in the third plurality of metal layers has a bottom surface, each metal layer in the second plurality of metal layers has a top surface and a bottom surface, each metal layer in the first plurality of metal layers has a top surface, and wherein a vertical displacement between the bottom surface of each metal layer in the third plurality of metal layers and the top surface of each metal layer in the second plurality of metal layers is larger than a vertical displacement between the bottom surface of each metal layer in the second plurality of metal layers and the top surface of each metal layer in the first plurality of metal layers.

15. A capacitor comprising:

a first interconnect level above a substrate;

a first plurality of metal layers in the first interconnect level;

a second interconnect level above the first interconnect level;

a second plurality of metal layers in the second interconnect level, wherein the metal layers in the second plurality of metal layers are electrically floating;

a third interconnect level above the second interconnect level; and a third plurality of metal layers in the third interconnect level, wherein each metal layer in the third plurality of metal layers is aligned above each metal layer in the first plurality of metal layers along a vertical direction, and wherein each metal layer in the third plurality of metal layers has an opposite polarity to each respective metal layer in the first plurality of metal layers aligned along the vertical direction.

16. The capacitor of claim 15, wherein the metal layers in the second plurality of metal layers are not connected to a voltage source or a current source.

17. The capacitor of claim 15, wherein the second interconnect level is immediately above the first interconnect level and immediately below the third interconnect level.

* * * * *